United States Patent
Khorram

(10) Patent No.: US 7,391,596 B2
(45) Date of Patent: Jun. 24, 2008

(54) HIGH FREQUENCY INTEGRATED CIRCUIT PAD CONFIGURATION INCLUDING ESD PROTECTION CIRCUITRY

(75) Inventor: Shahla Khorram, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 286 days.

(21) Appl. No.: 10/742,496

(22) Filed: Dec. 19, 2003

(65) Prior Publication Data

US 2005/0135026 A1    Jun. 23, 2005

(51) Int. Cl.
*H02H 9/00* (2006.01)
(52) U.S. Cl. ......................................... 361/58
(58) Field of Classification Search ............... 361/58
See application file for complete search history.

(56) References Cited

U.S. PATENT DOCUMENTS

| 6,009,314 | A  | * | 12/1999 | Bjork et al. ............... 455/83 |
| 6,009,318 | A  | * | 12/1999 | Freed ......................... 455/326 |
| 6,537,868 | B1 | * | 3/2003  | Yu ............................... 438/237 |
| 6,614,229 | B1 | * | 9/2003  | Clark et al. ................. 324/338 |
| 6,721,544 | B1 | * | 4/2004  | Franca-Neto ............... 455/83 |
| 6,735,418 | B1 | * | 5/2004  | MacNally et al. ............ 455/78 |
| 6,839,577 | B2 | * | 1/2005  | Krenz et al. ............ 455/575.7 |
| 6,982,609 | B1 | * | 1/2006  | McKay et al. ............... 333/25 |
| 2002/0121924 | A1 | * | 9/2002 | Yue et al. ..................... 327/310 |
| 2003/0058591 | A1 | * | 3/2003 | Johnson ....................... 361/56 |
| 2005/0107042 | A1 | * | 5/2005 | De Graauw .................. 455/78 |

FOREIGN PATENT DOCUMENTS

JP        2003-018039    * 1/2003

* cited by examiner

*Primary Examiner*—Michael J Sherry
*Assistant Examiner*—Ann T Hoang
(74) *Attorney, Agent, or Firm*—Garlick Harrison & Markison

(57) ABSTRACT

A high frequency integrated circuit (IC) pad configuration includes a first IC pad, an inductor, and a second IC pad. The first IC pad is directly coupled to input or output a high frequency signal, wherein no electrostatic discharge (ESD) protection circuitry is directly coupled to the first IC pad. The inductor includes a first node and a second node, wherein the first node of the inductor is directly coupled to the first IC pad, and wherein the inductor has a high impedance with respect to a desired input or desired output impedance of the first IC pad at frequencies of the high frequency signal. The second IC pad is directly coupled to a power connection, to the second node of the inductor, and to an ESD protection circuit, wherein the inductor and the ESD protection circuit of the second IC pad substantially provides ESD protection for the first IC pad.

6 Claims, 5 Drawing Sheets

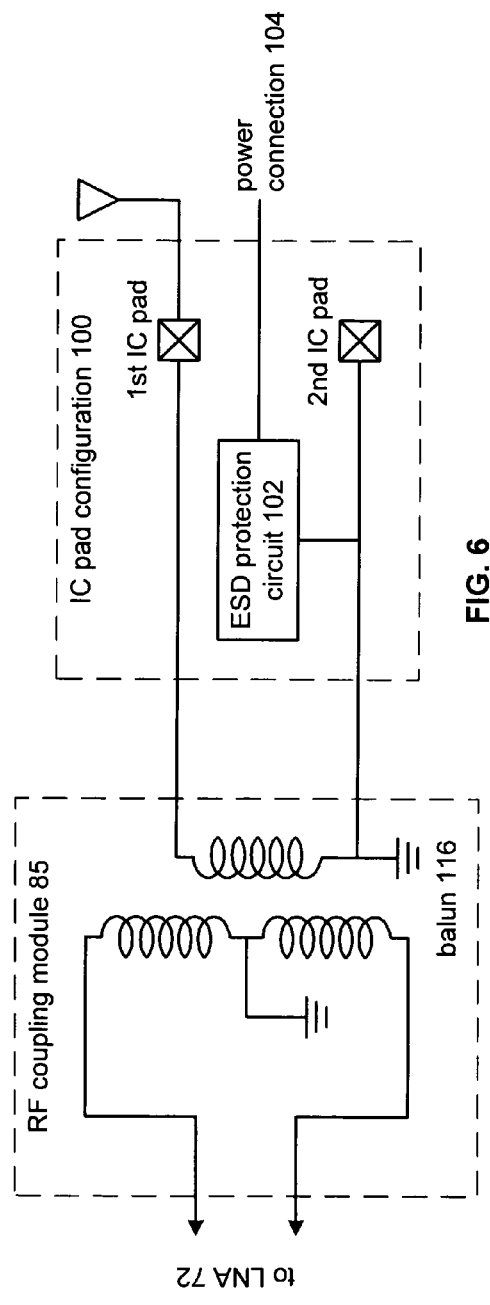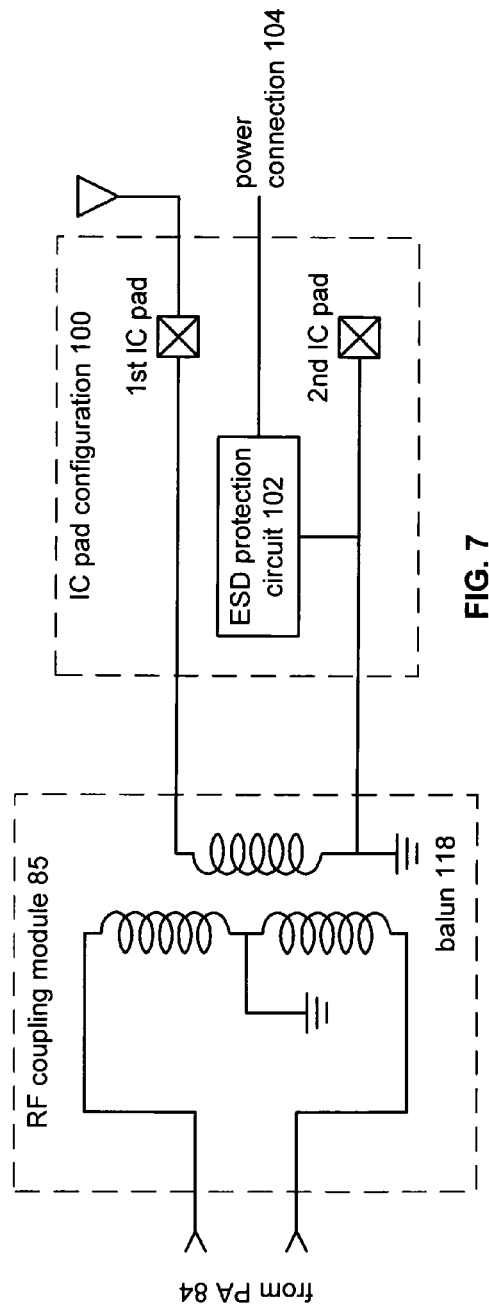

HIGH FREQUENCY INTEGRATED CIRCUIT PAD CONFIGURATION INCLUDING ESD PROTECTION CIRCUITRY

CROSS REFERENCE TO RELATED PATENTS

BACKGROUND OF THE INVENTION

1. Technical Field of the Invention

This invention relates generally to wireless communications systems and more particularly to wireless communication devices.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As with any integrated circuit (IC), when a radio transceiver is implemented on an integrated circuit, it must include electro-static discharge (ESD) protection circuitry. As is known, ESD protection circuitry includes reverse coupled diodes between input pins of the IC and ground of the IC, between the input pins of the IC and a power supply connection of the IC, between output pins of the IC and ground of the IC, and between the output pins of the IC and the power supply connection of the IC. The reverse coupled diodes function to route the energy of an ESD event occurring on an input pin or an output pin to ground and/or to the power supply connection of the IC.

For input and output pins of an IC that carry low frequency signals (e.g., in the tens of MHz or below), the parasitic capacitance of the reverse coupled diodes of the ESD protection circuitry does not significantly affect the signals. However, as the frequency of the signals on input and/or output pins increases, the parasitic capacitance and other parasitic components of the diodes begin to adversely affect the signal (i.e., cause distortion of the signal, couple power supply noise into the signal, etc.).

As is further known, a radio frequency integrated circuit (i.e., a radio transceiver implemented on an IC) includes high frequency input and output pins for transceiving radio frequency signals (e.g., signals having a frequency in the hundreds of MHz to the tens of GHz). Since these input and output pins must have ESD protection, the parasitic components of reverse coupled diodes do adversely affect the RF signals.

Therefore, a need exists for electrostatic discharge (ESD) protection of RF input and output pins of a radio frequency integrated circuit that does not adversely affect RF signals transceived via the RF input and output connections.

BRIEF SUMMARY OF THE INVENTION

The high frequency integrated circuit pad configuration including ESD protection circuitry of the present invention substantially meets these needs and others. In one embodiment, a high frequency integrated circuit (IC) pad configuration includes a first IC pad, an inductor, and a second IC pad. The first IC pad is directly coupled to input or output a high frequency signal, wherein no electrostatic discharge (ESD) protection circuitry is directly coupled to the first IC pad. The inductor includes a first node and a second node, wherein the first node of the inductor is directly coupled to the first IC pad, and wherein the inductor has a high impedance with respect to a desired input or desired output impedance of the first IC pad at frequencies of the high frequency signal. The second IC pad is directly coupled to a power connection, to the second node of the inductor, and to an ESD protection circuit, wherein the inductor and the ESD protection circuit of the second IC pad substantially provides ESD protection for the first IC pad. As such, ESD protection of RF input and output pins of a radio frequency integrated circuit is provided without adversely affecting the RF signals transceived via the RF input and output pins.

BRIEF DESCRIPTION OF THE SEVERAL VIEWS OF THE DRAWINGS

FIG. 6 is a schematic block diagram of yet another embodiment of an RF coupling module and IC pad configuration in accordance with the present invention; and FIG. 7 is a schematic block diagram of a further embodiment of an RF coupling module and IC pad configuration in accordance with the present invention.

DETAILED DESCRIPTION OF THE INVENTION

Figure 1:
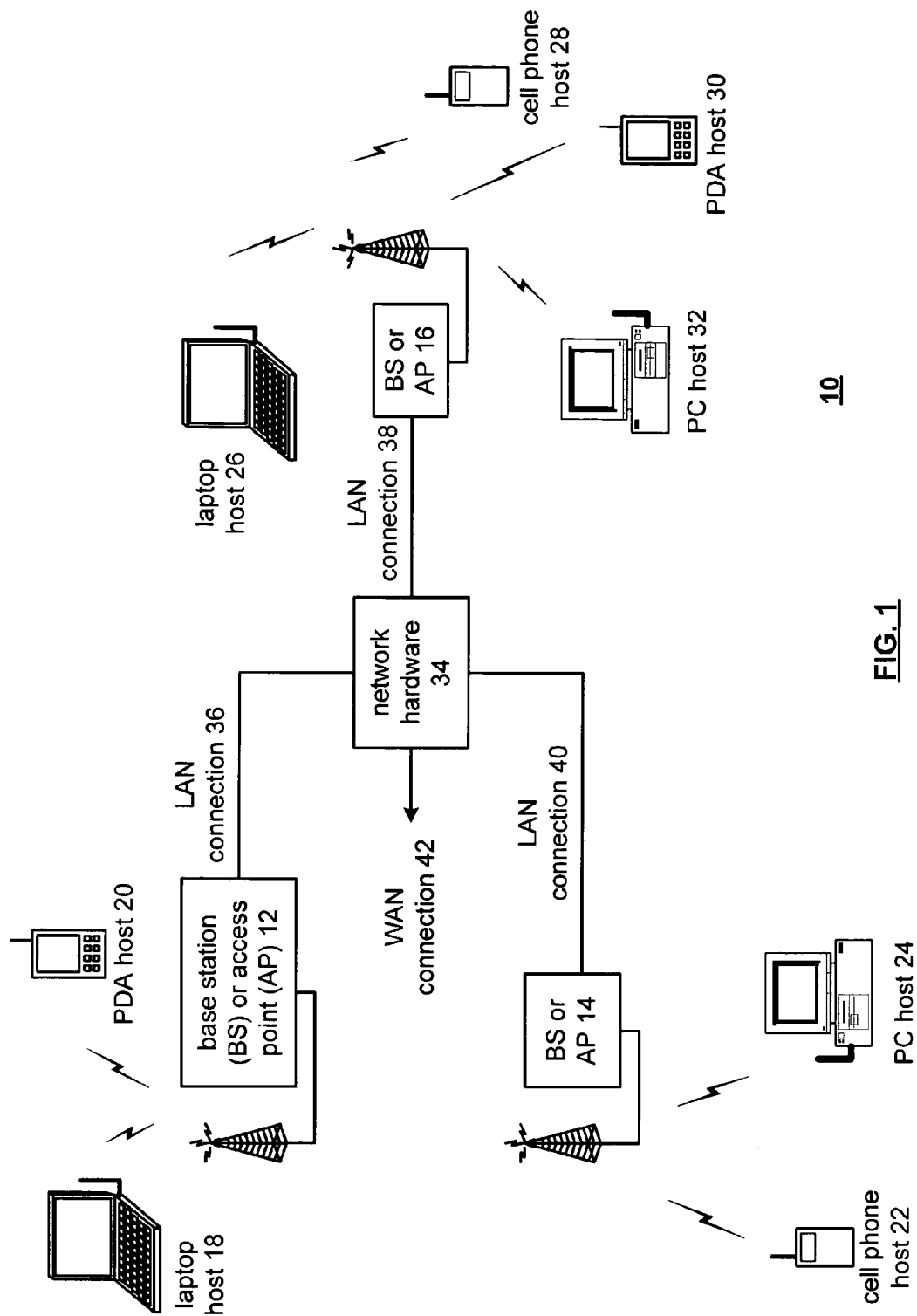
FIG. 1 is a schematic block diagram of a wireless communication system in accordance with the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
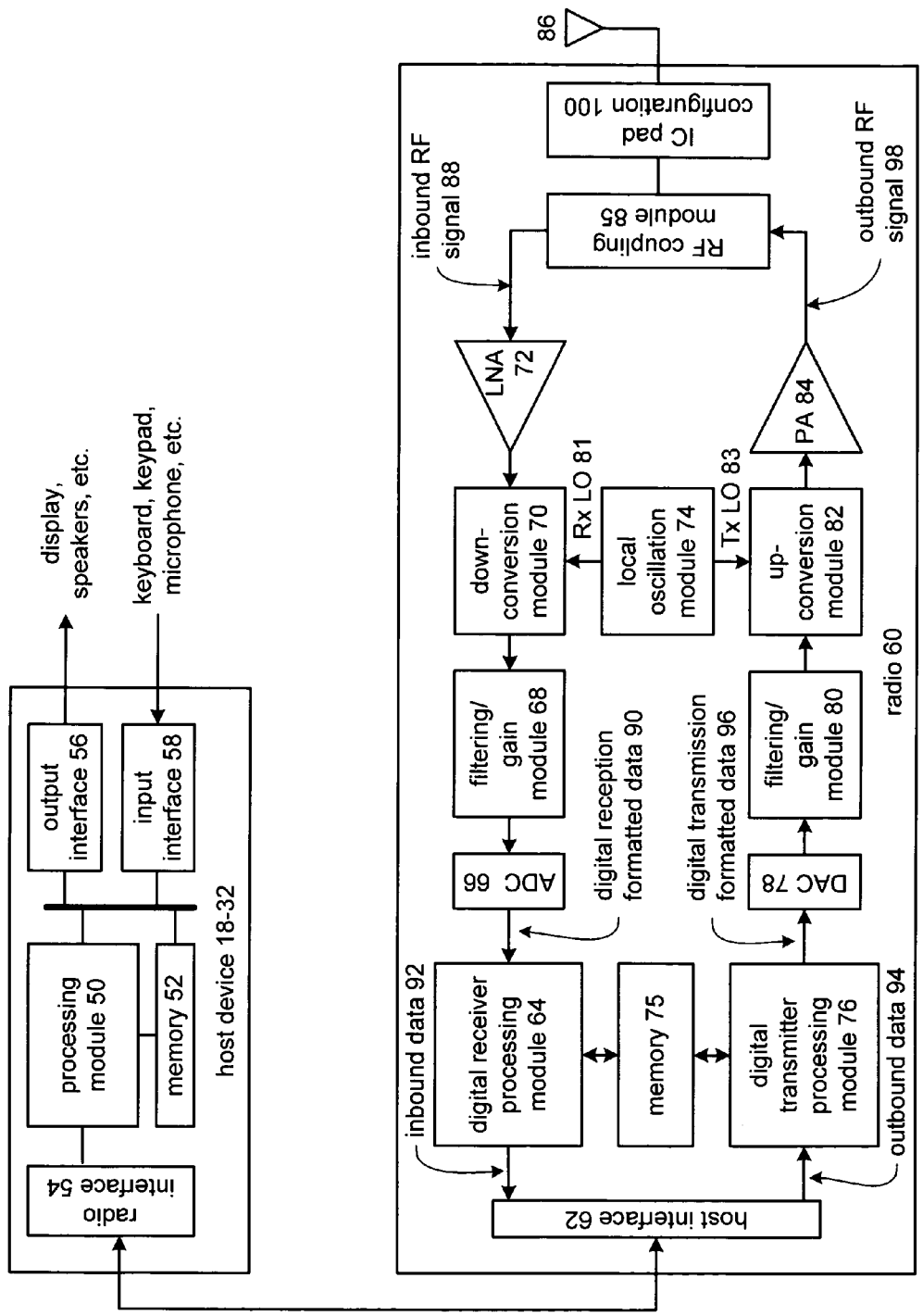
FIG. 2 is a schematic block diagram of a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a digital to analog converter 78, a local oscillation module 74, memory 75, a digital transmitter processing module 76, a receiver section, a transmitter section, a radio frequency (RF) coupling module 85, and an integrated circuit (IC) pad configuration 100. The receiver section includes a filtering/gain module 68, an IF mixing down conversion stage 70, and a low noise amplifier 72. The transmitter section includes a filtering/gain module 80, an IF mixing up conversion stage 82, and a power amplifier 84. The IC pad configuration is coupled to an antenna 86. The antenna 86 may be a single antenna that is shared by the transmitter and receiver sections as regulated by the RF coupling module 85, or may include separate antennas for the transmitter section and receiver section. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 converts the analog baseband or low IF signal into an RF signal based on a transmitter local oscillation 83 provided by local oscillation module 74. The power amplifier 84 amplifies the RF signal to produce outbound RF signal 98, which is provided to the antenna 86 for transmission to a targeted device such as a base station, an access point and/or another wireless communication device via the RF coupling module 85 and the IC pad configuration 100.

The radio 60 also receives an inbound RF signal 88 via the antenna 86, which was transmitted by a base station, an access point, or another wireless communication device. The antenna 86 provides the inbound RF signal 88 to the low noise amplifier 72 via the RF coupling module 85 and the IC pin configuration 100. The low noise amplifier 72 amplifies the RF signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
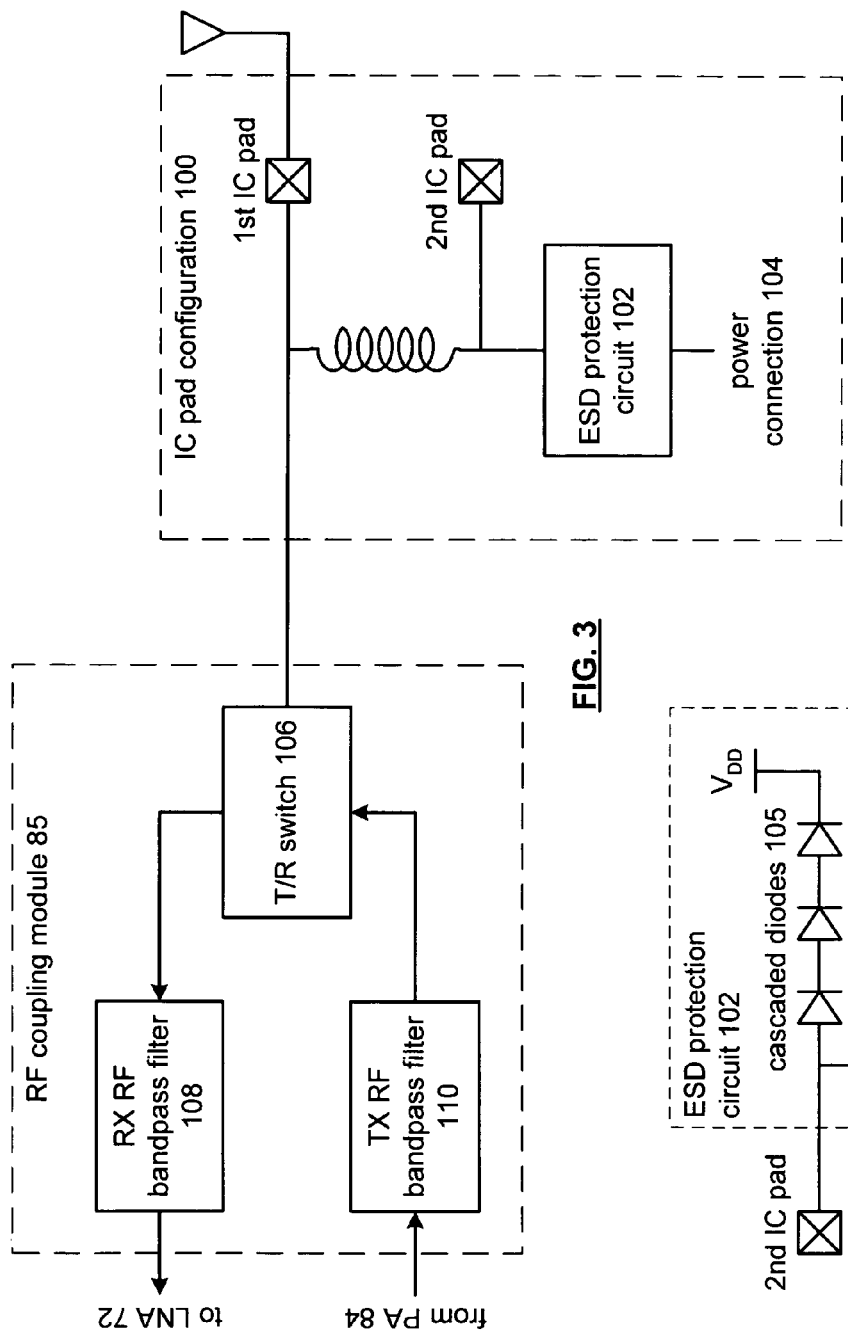
FIG. 3 is a schematic block diagram of one embodiment of an RF coupling module and IC pad configuration in accordance with the present invention.

FIG. 3 is a schematic block diagram of an embodiment of the RF coupling module 85 coupled to the IC pad configuration 100. In this embodiment, the RF coupling module 85 includes a transmit/receive (T/R) switch 106, a receiver (RX) RF band-pass filter 108 and a transmit (TX) RF band-pass filter 110. The IC pad configuration 100 includes a $1^{st}$ IC pad, a $2^{nd}$ IC pad, an inductor, and an ESD (electrostatic discharge) protection circuit 102.

In operation, the RF coupling module 85 provides access to antenna 86 for the receiver section of radio 60 or the transmit section of radio 60. In the transmit mode, the T/R switch 106 couples the TX RF band-pass filter 110 to the $1^{st}$ IC pad of the IC configuration 100. In the receive mode, the T/R switch 106 couples the RX RF band-pass filter 108 to the $1^{st}$ IC pad. As such, the RF coupling via the antenna is either in a transmit mode or receive mode.

As configured, the IC pad configuration 100 provides ESD protection of the $1^{st}$ IC pad via the inductor and the ESD protection circuit 102 coupled to the $2^{nd}$ IC pad. The $2^{nd}$ IC pad may be coupled for a lower frequency input or output signal (with respect to the high frequency signal coupled to the $1^{st}$ IC pad), coupled to ground, or coupled to a power supply connection of the integrated circuit. The inductance of inductor L is such that at the frequencies of the received or transmitted RF signals, the inductor has a high impedance (e.g., at least four times the load on the $1^{st}$ IC pad), which then provides minimal loading on the $1^{st}$ IC pad. During an ESD event, however, the inductance is sufficient to provide a low impedance path between the $1^{st}$ IC pad and the $2^{nd}$ IC pad such that the ESD protection circuit 102 protects both the $1^{st}$ IC pad and the $2^{nd}$ IC pad. By inductively coupling the $1^{st}$ IC pad to the $2^{nd}$ IC pad, the ESD protection circuit 102 does not act as a load on the high frequency signals transceived via the $1^{st}$ IC pad. Accordingly, the ESD protection circuit 102 does not adversely affect the transceiving of high frequency signals via the 1st IC pad. As one of average skill in the art will appreciate, the $1^{st}$ IC pad may be configured to transceive high frequency signals other than radio frequency signals. As one of average skill in the art will further appreciate, the inductance of the inductor may range from a few pico-Henries to tens of nano-Henries depending on the frequency of the signal and the desired impedance at that operating frequency.

Figure 4:
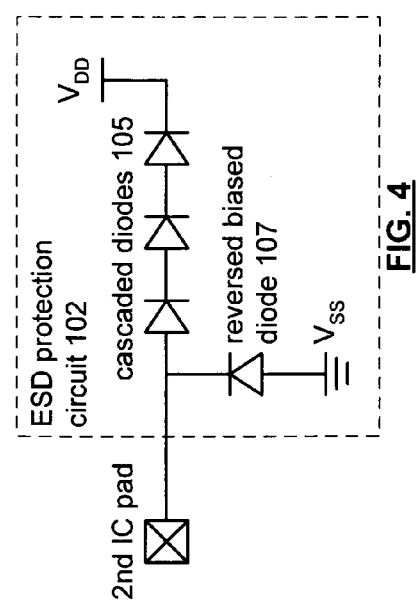
FIG. 4 is a schematic block diagram of an ESD protection circuit in accordance with the present invention.

FIG. 4 is a schematic block diagram of an embodiment of the ESD protection circuit 102 that includes cascaded diodes 105 and a reverse bias diode 107. As shown, the cascaded diodes 105 are coupled between the $2^{nd}$ IC pad and the power supply line ($V_{dd}$). The reverse bias diode 107 is coupled between the $2^{nd}$ IC pad and ground ($V_{ss}$) of the integrated circuit. As such, if am ESD event occurs on the $1^{st}$ or $2^{nd}$ IC pad, the reverse bias diode 107 will become active if the voltage on the $2^{nd}$ IC pad and hence the voltage on the $1^{st}$ IC pad drops below 1 diode voltage level below ground. Conversely, the cascaded diodes 105 will become active if the voltage on the $1^{st}$ or $2^{nd}$ IC pad exceeds, in this example, 3 diode drops above the power supply line ($V_{DD}$).

Figure 5:
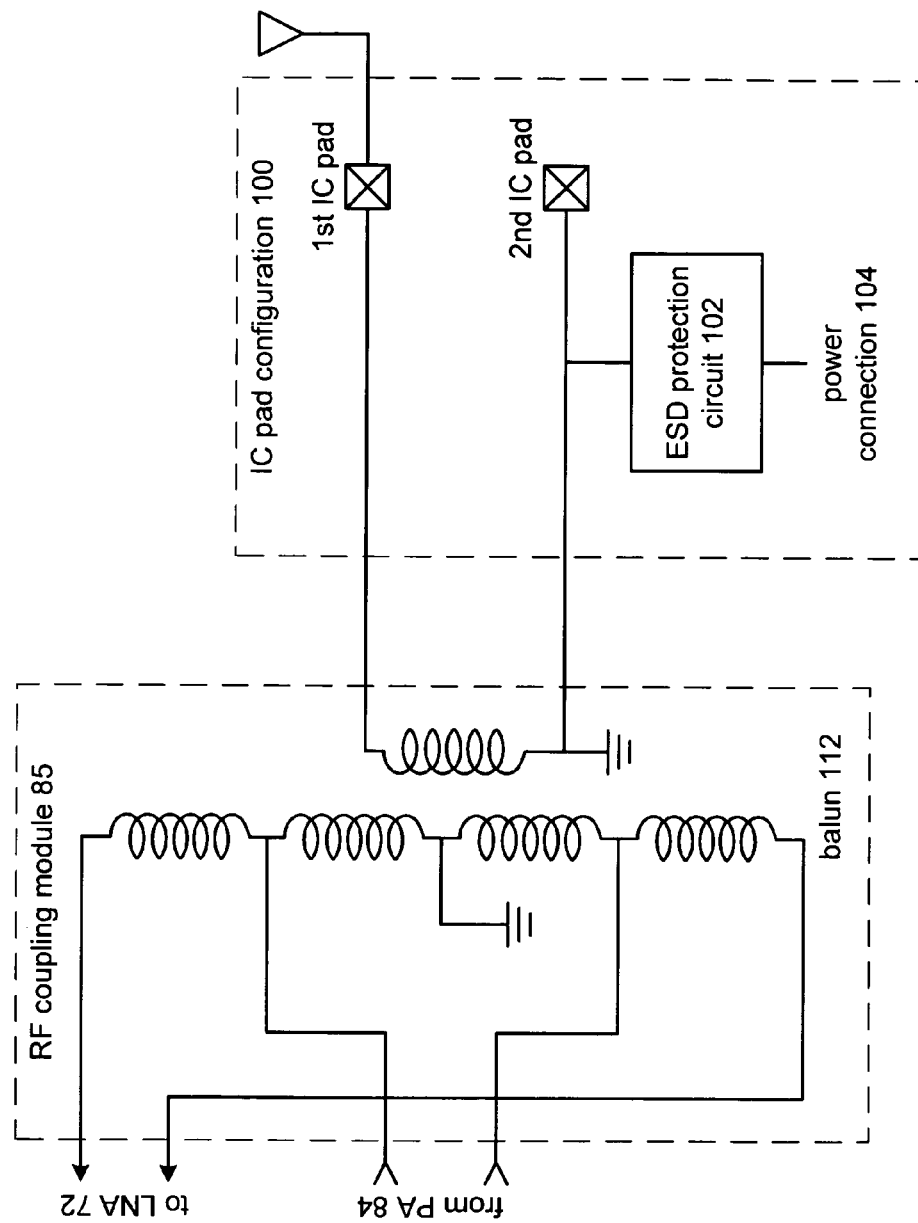
FIG. 5 is a schematic block diagram of another embodiment of an RF coupling module and IC pad configuration in accordance with the present invention.

FIG. 5 is another embodiment of the RF coupling module 85 and the IC pad configuration 100. In this embodiment, the RF coupling module 85 includes a transformer balun 112. The transformer balun 112 includes a single-ended winding that is coupled to the $1^{st}$ and $2^{nd}$ IC pads of the IC configuration 100 and a differential winding that is coupled to ground of the IC, the power amplifier 84 and the low noise amplifier 72 of radio 60. The IC pad configuration 100 is further shown to include the ESD protection circuit 102 that is coupled to a power connection 104, which may be $V_{DD}$ or $V_{SS}$.

In this embodiment, the single-ended winding of balun 112 provides the inductive coupling between the $1^{st}$ and $2^{nd}$ IC pads such that during an ESD event, ESD protection circuit 102 protects both the 1$^{st}$ and 2$^{nd}$ IC pads. As such, RF signals, or other high frequency signals, may be transceived via the 1$^{st}$ IC pad and provided to a power amplifier 84 or a low noise amplifier 72 during normal operations.

FIG. 6 is a schematic block diagram of yet another embodiment of the RF coupling module 85 and the IC pad configuration 100. In this embodiment, the RF coupling module 85 includes a transformer balun 116 that includes a single-ended winding that is coupled to the 1$^{st}$ and 2$^{nd}$ IC pads of the IC pad configuration 100 and a differential winding that is coupled to the low noise amplifier 72. In this embodiment, the single-ended winding of the balun 116 provides the inductive coupling between the 1$^{st}$ and 2$^{nd}$ IC pads such that during an ESD event, the ESD protection circuit 102 protects both the 1$^{st}$ and 2$^{nd}$ IC pads.

FIG. 7 is a schematic block diagram of yet another embodiment of the RF coupling module 85 and the IC pad configuration 100. In this embodiment, the RF coupling module 85 includes a transformer balun 118 that is coupled to the power amplifier 84. In this embodiment, the single-ended winding of balun 118 provides the inductive coupling between the 1$^{st}$ and 2$^{nd}$ IC pads such that the ESD protection circuit 102, during an ESD event, protects both the 1$^{st}$ and 2$^{nd}$ IC pads.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a high frequency integrated circuit pad configuration that provides ESD protection for integrated circuit pads that transceive high frequency signals without adversely affecting such signals. As one of average skill in the art will appreciate, other embodiments may be derived from the teaching of the present invention without deviating from the scope of the claims.

What is claimed is:

1. A high frequency integrated circuit (IC) pad configuration comprises:
 a first IC pad to directly couple to an antenna to transmit and receive a high frequency signal;
 an inductor to operate as a single-ended winding of an inductively coupled balun for direct coupling to the antenna via the first IC pad and electrically disposed on an antenna side of a transmit/receive switch, in which a first node of the inductor is coupled to the first IC pad and the inductor has a desired high impedance at a frequency of the high frequency signal, but the inductor has lower impedance at frequencies of an electrostatic discharge (ESD);
 a differential winding inductively coupled to the single-ended winding to form the balun with the single-ended winding, the differential winding disposed across a first terminal and a second terminal in which a center tap of the differential winding is coupled to a supply return, the differential winding having a third terminal at a winding tap located between the first terminal and the center tap, and the differential winding also having a fourth terminal at a winding tap located between the second terminal and the center tap, wherein a single balun is used for both transmit and receive modes of operation, in which the first and second terminals are differentially coupled to a low noise amplifier of a receiver and the third and fourth terminals are differentially coupled to a power amplifier of a transmitter;
 an ESD protection circuit coupled to a second node of the inductor so that the ESD protection circuit is not directly coupled to the first IC pad, in order not to provide loading on the first IC pad; and
 a second IC pad coupled to the second node of the inductor and to the ESD protection circuit, wherein the second IC pad is to be coupled to another circuit connection having a signal of a lower frequency than the high frequency signal on the first IC pad, so that the ESD protection circuit provides ESD protection to both first and second IC pads.

2. The high frequency IC pad configuration of claim 1 wherein the high frequency signal is a radio frequency signal.

3. The high frequency IC pad configuration of claim 1, wherein the another circuit connection coupled to the second IC pad is a supply voltage ($V_{DD}$), a power supply return ($V_{ss}$), or a band gap reference.

4. A radio frequency integrated circuit (RFIC) comprises:
 a receiver section operably coupled to convert inbound radio frequency (RF) signals into inbound baseband signals based on a receiver local oscillation;
 a transmitter section operably coupled to convert outbound baseband signals into outbound RF signals based on a transmitter local oscillation;
 RF coupling module operably coupled to provide the inbound RF signals to the receiver section when the RFIC is in a receive mode and to provide the outbound RF signals for transmission when the RFIC is in a transmit mode; and
 an integrated circuit (IC) pad configuration coupled to provide electrostatic protection (ESD) for the RF coupling module, wherein the IC pad configuration includes:
 a first IC pad to directly couple to an antenna to transmit outbound and receive inbound RF signals;
 an inductor to operate as a single-ended winding of an inductively coupled balun for direct coupling to the antenna via the first IC pad and electrically disposed on an antenna side of a transmit/receive switch of the RE coupling module, in which a first node of the inductor is coupled to the first IC pad and the inductor has a desired high impedance at a frequency of the RE signals, but the inductor has lower impedance at frequencies of an electrostatic discharge (ESD);
 a differential winding inductively coupled to the single-ended winding to form the balun with the single-ended winding, the differential winding disposed across a first terminal and a second terminal in which a center tap of the differential winding is coupled to a supply return, the differential winding having a third terminal at a winding tap located between the first terminal and the center tap, and the differential winding also having a fourth terminal at a winding tap located between the second terminal and the center tap, wherein a single balun is used for both transmit and receive modes of operation, in which the first and second terminals are differentially coupled to a low noise amplifier of the receiver section and the third and fourth terminals are differentially coupled to a power amplifier of the transmitter section;

ESD protection circuit coupled to a second node of the inductor so that the ESD protection circuit is not directly coupled to the first IC pad, in order not to provide loading on the first IC pad; and a second IC pad coupled to the second node of the inductor and to the ESD protection circuit, wherein the second IC pad is to be coupled to another circuit connection having a signal of a lower frequency than the RF signals on the first IC pad, so that the ESD protection circuit provides ESD protection to both first and second IC pads.

5. The RFIC of claim 4, wherein the another circuit connection coupled to the second IC pad is a supply voltage ($V_{DD}$), a power supply return ($V_{SS}$), or a band gap reference.

6. The RFIC of claim 4, wherein the ESD protection circuit further includes cascaded diodes coupled from the second IC pad to a supply voltage ($V_{DD}$) and a reverse bias diode coupled between the second IC pad and a power supply return ($V_{SS}$).

* * * * *

UNITED STATES PATENT AND TRADEMARK OFFICE
CERTIFICATE OF CORRECTION

PATENT NO.         : 7,391,596 B2                                        Page 1 of 1
APPLICATION NO.    : 10/742496
DATED              : June 24, 2008
INVENTOR(S)        : Shahla Khorram It is certified that error appears in the above-identified patent and that said Letters Patent is hereby corrected as shown below:

Column 8, line 60, in Claim 4: replace "RE" with --RF--.

Column 8, line 62, in Claim 4: replace "RE" with --RF--.

Signed and Sealed this

Twenty-fourth Day of March, 2009

JOHN DOLL
*Acting Director of the United States Patent and Trademark Office*